(12) United States Patent
Gerwig et al.

(10) Patent No.: US 7,840,622 B2
(45) Date of Patent: Nov. 23, 2010

(54) METHOD AND FLOATING POINT UNIT TO CONVERT A HEXADECIMAL FLOATING POINT NUMBER TO A BINARY FLOATING POINT NUMBER

(75) Inventors: Guenter Gerwig, Simmozheim (DE); Klaus Michael Kroener, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 1004 days.

(21) Appl. No.: 11/489,920

(22) Filed: Jul. 20, 2006

(65) Prior Publication Data

US 2007/0022152 A1   Jan. 25, 2007

(30) Foreign Application Priority Data

Jul. 25, 2005   (EP) ................................. 05106817

(51) Int. Cl.
*G06F 7/00* (2006.01)
*G06F 15/00* (2006.01)
*G06F 7/38* (2006.01)

(52) U.S. Cl. .................. 708/204; 708/501; 708/495; 708/673; 712/222; 341/50

(58) Field of Classification Search ......... 712/220–222; 708/495–499, 501, 204–205, 673
See application file for complete search history.

(56) References Cited

U.S. PATENT DOCUMENTS 5,251,321 A * 10/1993 Boothroyd et al. ............ 341/84
5,742,535 A * 4/1998 Schwarz et al. ............. 708/499
5,742,536 A * 4/1998 Schwarz et al. ............. 708/499
5,875,123 A * 2/1999 Dao Trong et al. .......... 708/505
5,889,980 A * 3/1999 Smith, Jr. .................... 712/222
6,813,626 B1 * 11/2004 Chng et al. .................. 708/501
2004/0059762 A1 * 3/2004 Yang .......................... 708/204
2006/0190708 A1 * 8/2006 Schwarz et al. ............. 712/221

OTHER PUBLICATIONS

G. Gerwig et al. "The IBM eServer z990 Floating-Point Unit", IBM Journal of Research and Development, vol. 48, No. 3/4, May/Jul. 2004, pp. 311-322.
IEEE Standard 754-1985 "IEEE Standard for Binary Floating-Point Arithmetic", IEEE 1985, pp. i - 14.

* cited by examiner

*Primary Examiner*—Lewis A Bullock, Jr.
*Assistant Examiner*—Joseph Kelly
(74) *Attorney, Agent, or Firm*—Steven Chiu

(57) ABSTRACT

Method to convert a hexadecimal floating point number (H) into a binary floating point number by using a Floating Point Unit (FPU) with fused multiply add with an A-register a B-register for two multiplicand operands and a C-register for an addend operand, wherein a leading zero counting unit (LZC) is associated to the addend C-register, wherein the difference of the leading zero result provided by the LZC and the input exponent (E) is calculated by a control unit and determines based on the Raw-Result-Exponent a force signal (F) with special conditions like 'Exponent Overflow', 'Exponent Underflow', and 'Zero Result'.

2 Claims, 2 Drawing Sheets

| Result Condition | Result for RM biased nearest | Result for RM Nearest | Result for RM Zero | Result for RM minus Infinity | Result for RM plus Infinity | Result Condition Code |
|---|---|---|---|---|---|---|
| + Overflow | + Infinity | + Infinity | + Max number | + Max Number | + Infinity | cc3 |
| +/- normal | Rounded normal | Rounded normal | Rounded normal | Rounded normal | Rounded normal | cc2 cc1 |
| +/_ Underflow | rounded denorm | rounded denorm | rounded denorm | rounded denorm | rounded denorm | cc2 / cc1 |
| +/- zero | +/- Zero | +/- Zero | +/- Zero | +/- Zero | +/- Zero | cc0 |
| - Overflow | - Infinity | - Infinity | - Max number | - Infinity | - Max number | cc3 |

Fig. 2

METHOD AND FLOATING POINT UNIT TO CONVERT A HEXADECIMAL FLOATING POINT NUMBER TO A BINARY FLOATING POINT NUMBER

BACKGROUND OF THE INVENTION

1. Field of the Invention

The present invention relates to a method to convert a hexadecimal floating point number into a binary floating point number by using a Floating Point Unit with fused multiply-add. Further the invention relates to a Floating Point Unit with fused multiply-add.

2. Background Art

A floating point unit with a fused multiply-add dataflow is described in G. Gerwig et. al. "The IBM eServer z990 floating point unit", IBM J. Res. & Dev., Vol. 48, No. 3/4, 2004. This floating point unit provides a convert instruction to convert the traditional S/390 HFP (Hex Floating-Point) into BFP (Binary Floating-Point) format according IEEE Standard 754. A good performance is important when results of older existing programs on HFP bases have to exchange data with newer programs on BFP bases. The BFP format is compliant to the IEEE 754 Standard and is more often used in new workloads like C++ and Java.

Floating point numbers are described in the form:

Sign*Base$^{(Exponent)}$*Mantissa, wherein, more precise, according to the different binary and hexadecimal formats the operands are built up in the hexadecimal HFP format:

$$(-1)^{SHFP}16^{EHFP-64}0.\text{Frac}56$$

and in the binary BFP format:

$$(-1)^{SBFP}2^{EBFP-1023}1.\text{Frac}52$$

The main difference between the formats is the base of the exponent E. It is 16 for HFP and 2 for BFP, which leads to a digit width of four for the HFP and a digit width of one for the BFP fraction.

Also the bias of the exponent is different. HFP uses a power of two (64=26), while BFP uses a power of two minus one (1023=210-1).

The fraction width is 56 for HFP and 52 for BFP.

Since the number range of BFP operands is higher than HFP operands, the result can be in the overflow or underflow range of the HFP target format. In that case, depending on the rounding mode and mask bits, a maximum number, a minimum number or infinity needs to be forced as output result of a transformation from HFP to BFP.

One example for a convert operation is the TBDR (CONVERT HFP TO BFP–Mnemonic='TBDR') instruction according to z/Architecture Principles of Operation (IBM SA 22-7832). This instruction has several special result requirements for result conditions like 'Zero Result', 'Overflow Condition' and 'Underflow Condition'. In these cases the results 'Maximum Number', 'Zero' and 'Infinity' have to be forced.

The state of the art implementation in a Floating Point Units uses the normalizer to detect the result conditions. Since this cannot be done within the normal pipelined operation, every convert instruction is executed in two pipelined cycles.

The logic needed to decide on the special result is too complex, to be done within the running cycle. Also the Condition-Code for these cases cannot be set in time.

SUMMARY OF THE INVENTION

It is therefore an object of the invention to provide a Floating Point Unit with fused multiply-add and a method which is able to perform and allows to convert the traditional HFP (Hex Floating-Point) into BFP (Binary Floating-Point) format according IEEE Standard 754 with improved performance.

The first part of the invention's technical purpose is met accordingly by a method to convert a hexadecimal floating point number operand into a binary floating point number by using a Floating Point Unit (FPU) with fused multiply-add with an A-register a B-register for two multiplicand operands and a C-register (21) for an addend operand, wherein a leading zero counting unit (LZC) is associated to the addend C-register, which is characzerized in the following steps:

loading the operand of the hexadecimal floating point number into the B-register and the C-register in parallel, counting the leading zeros of the operand by the leading zero counting unit while transferring the operand unchanged through the multiplier of the FPU, transferring the operand through the main adder stage of the FPU calculating the difference of the leading zero result provided by the LZC and the input exponent by a control unit and in parallel determine based on the Raw-Result-Exponent a force signal with special conditions like 'Exponent Overflow', 'Exponent Underflow', 'Zero Result', normalize the operand in the normalizer stage of the FPU, while determining in parallel in the control unit based on the special conditions, how to select final result by a rounder/reformatter according to 'use Normalized Result', 'force Infinity', 'force Maximum Number' and 'force Zero Result', output the final result as a binary floating point number by the rounder/reformatter according to control selection.

In a preferred embodiment of the invention said transferring of the operand through the multiplier stage is done by multiplying it with a neutral number, in particular 'one'.

In another preferred embodiment transferring of the operand through the main adder stage is done by adding a neutral number, in particular 'zero'.

The second part of the invention's technical purpose is met accordingly by the proposed Floating Point Unit (FPU), with fused multiply-add with an A-register a B-register for two hexadecimal multiplicand operands and a C-register for an hexadecimal addend operand, wherein a leading zero counting unit (LZC) is associated to the addend C-register, with a multiplier, a main adder stage and a normalizer and a rounder/reformatter, wherein the final result is provided as a binary floating point number by the rounder/reformatter, that is characterized in that a control unit is provided, which calculates the difference of the leading zero result provided by the LZC and the input exponent with a subtraction unit and which determines based on the raw-result-exponent a force signal (F) with special conditions like 'Exponent Overflow', 'Exponent Underflow', 'Zero Result', which force signal is used by the rounder/reformatter to select the output to 'use Calculated Normalized Result', 'force Infinity', 'force Maximum Number', 'force Zero Result'.

The invention provides a remarkable performance improvement since the determination of special conditions will be done in parallel to the conversion of the operand through the multiplier, adder, normalizer and rounder stage of the FPU.

Another benefit of the invention is that very few additional hardware components are needed.

BRIEF DESCRIPTION OF THE DRAWINGS

The present invention and its advantages are now described in conjunction with the accompanying drawings.

FIG. 2 is showing a table of result matrix for a convert instruction.

DETAILED DESCRIPTION

Figure 1:
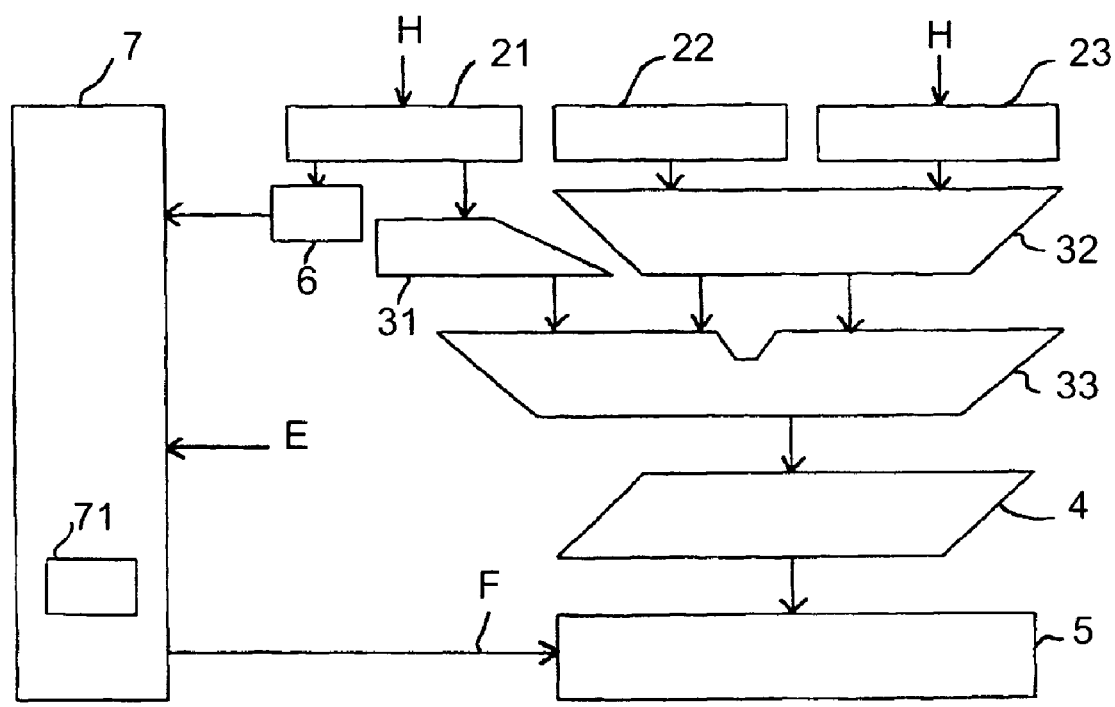
FIG. 1: Is showing a scheme of a Floating Point Unit according to the invention.

FIG. 1 depicts a scheme of a Floating Point Unit according to the invention that support fused multiply-add instructions compute A*C+B for three floating point numbers A, B, and C.

According to the Invention, the zero detection, overflow detection and underflow detection are done ahead with the leading-zero-count out of the C-Register of the FPU. For that, the operand has to be loaded additionally into the C-Register.

The Dataflow for the C-Register 21 includes a Leading Zero counting (LZC) 6 for the operand, which is already needed for other reasons in the C-Operand path. With the LZC and the input exponent, 'Zero', 'Overflow' as well as 'Underflow' can be detected early and in parallel to the transferring of the operand from the B-register 23, wherein the operand was also loaded, through the multiplier stage 32 and the main adder stage 33 of the FPU. In case of HFP denormal operands the LZC has to be subtracted from the Input exponent, to get the potential result exponent, which indicates overflow and underflow conditions. This calculation of the difference of the leading zero result provided by the LZC 6 and the input exponent E is done by a control unit 7 which determines based on the Raw-Result-Exponent a force signal F with special conditions like 'Exponent Overflow', 'Exponent Underflow', 'Zero Result'.

The special results (Maximum Number, Zero and Infinity) can be forced in time for the rounder to allow a pipelined execution in one cycle. Also the Condition Code is provided one cycle ahead, which allows a subsequent instruction that depends on the Condition Code (i.e., BCT Branch on Condition) of this conversion instruction to be executed earlier.

The operand of the B-register 23 travels through the multiplier stage 32—in particular by multiplying it with a neutral number like one—and the main adder stage 33—in particular by adding a neutral number like zero—and is after that normalized in the normalizer stage 4. In parallel the control unit 7 determines based on the special conditions, how to select final result by a rounder/reformatter 5 according to 'use Normalized Result', 'force Infinity', 'force Maximum Number' and 'force Zero Result'. After the normalization the operand is transferred to the rounder/reformatter 5, which outputs the final result as a binary floating point number according to control selection.

With that the instruction can be executed in a single cycle in every case and with that the performance is duplicated to the state-of-the-art methods.

Other as on the normal BFP instructions, TBDR needs to set the Condition-Code dependent on the special results of the instruction. With the 'Pre detection' of the overflow conditions, the Condition-code can be also set right in time for a pipelined execution.

The table of FIG. 2 shows the result matrix of a convert instruction in details (here for the TBDR instruction).

The first column is showing the result conditions:
+Overflow: result exponent too large to be expressed in target format (positive)
+/−normal: normal result which fits into target format (positive or negative and not zero)
+/−Underflow: result exponent too small to be expressed in target format (positive or negative)
+/−zero: result is zero (positive or negative)
−Overflow: result exponent too large to be expressed in target format (negative)

The next columns are showing the final results with different rounding conditions, whereby RM is the Rounding mode, which can be
Round to biased nearest
Round to nearest
Round to Zero
Round to minus infinity
Round to plus infinity The last column is showing the condition-code to be set, which can be
cc0 result is zero
cc1 result is negative
cc2 result is positive
cc3 result special case The benefits of the invention are:
The performance is doubled for the TBDR execution, which means the CPI (Cycles per Instruction) value decreases from 2 to 1.

There would no modification to the fraction dataflow be required, which is typically done in custom hardware, where design and design modification is very expensive.

Limit effort needed in Control Logic, which are mainly some staging latches and a small subtractor. Design of such Control Logic is relatively cheaper, since the logic can be synthesized.

COMMERCIAL APPLICABILITY

The invention is commercially applicable particularly in the field of production, test and the operation of integrated chips in a wide field of applications in integrated chip technology since speeding up calculations is a needed technique.

We claim:

1. A method to convert a hexadecimal floating point number having an operand (H) and an exponent (E) into a binary floating point number by using a Floating Point Unit (FPU) with fused multiply-add with an A-register and a B-register accessed by a multiplier stage; a C-register accessed by a main adder stage, wherein a leading zero counting unit (LZC) is associated to the addend C-register; a control unit; a normalizer; and a rounder/reformatter; the method characterized in the following steps:

loading the operand (H) into the B-register and the C-register in parallel;

counting the leading zeros of the operand (H) by the leading zero counting unit while transferring the operand (H) unchanged through the multiplier stage of the FPU by multiplying the operand (H) with a neutral number;

transferring the operand (H) unchanged through the main adder stage of the FPU by adding the operand (H) with a neutral number;

calculating the difference of the leading zero result provided by the LZC and the input exponent (E) by the control unit and storing the difference as a Raw-Result-Exponent, wherein based on the Raw-Result-Exponent, determining a force signal (F) specifying special conditions consisting of 'Exponent Overflow', 'Exponent Underflow', and 'Zero Result';

normalizing the operand (H) in the normalizer stage of the FPU, and in parallel determining by the control unit, based on the special conditions, how to output the final result by the rounder/reformatter according to the formats consisting of: 'use Normalized Result', 'force Infinity', 'force Maximum Number', and 'force Zero Result'; and outputting the final result as a binary floating point number by the rounder/reformatter according to the control unit's selection.

2. A Floating Point Unit (FPU) with fused multiply-add able to convert a hexadecimal floating point number having an operand (H) and an exponent (E) into a binary floating point number, comprising:

an A-register and a B-register storing two hexadecimal multiplicand operands, wherein the B-register is loaded with the operand (H);

a C-register storing a hexadecimal addend operand, wherein the C-register is loaded with the operand (H) in parallel with the B-register being loaded with the operand (H);

a leading zero counting unit (LZC) associated to the addend C-register, which counts the leading zeros of the operand (H);

a multiplier stage of the FPU operating in parallel to the LZC, which transfers the operand (H) through the multiplier stage unchanged by multiplying the operand (H) with a neutral number;

a main adder stage of the FPU, which transfers the operand (H) through the adder stage unchanged by adding the operand (H) with a neutral number;

a control unit calculating the difference of the leading zero result provided by the LZC and the input exponent (E) with a subtraction unit and storing the difference as a Raw-Result-Exponent, wherein based on the Raw-Result-Exponent, determining a force signal (F) specifying special conditions consisting of 'Exponent Overflow', 'Exponent Underflow', and 'Zero Result';

a normalizer stage of the FPU, normalizing the operand (H), operating in parallel to the control unit determining, based on the special conditions, how to output the final result by a rounder/reformatter according to the formats consisting of; 'use Calculated Normalized Result', 'force Infinity', 'force Maximum Number', and 'force Zero Result';

a rounder/reformatter outputting the final result as a binary floating point number according to the control unit's selection.

* * * * *